(12) United States Patent
Gai et al.

(10) Patent No.: US 6,658,458 B1
(45) Date of Patent: Dec. 2, 2003

(54) CASCADING ASSOCIATIVE MEMORY ARRANGEMENT

(75) Inventors: Silvano Gai, San Jose, CA (US); Keith McCloghrie, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 678 days.

(21) Appl. No.: 09/599,311

(22) Filed: Jun. 22, 2000

(51) Int. Cl.$^7$ .............................................. G06F 12/00
(52) U.S. Cl. ...................................... 709/215; 709/206
(58) Field of Search ................................ 709/215, 206

(56) References Cited

U.S. PATENT DOCUMENTS

| | | | |
|---|---|---|---|
| 5,450,351 A | 9/1995 | Heddes | 365/49 |
| 6,055,364 A | 4/2000 | Speakman et al. | 709/229 |
| 6,101,115 A | 8/2000 | Ross | 365/49 |
| 6,219,706 B1 | 4/2001 | Fan et al. | 709/225 |

OTHER PUBLICATIONS

U.S. patent application Ser. No. 09/295,187 Gal, et al., filed Apr. 20, 1999.

U.S. patent application Ser. No. 09/535,810, Gai, et al., filed Mar. 28, 2000.

Gupta, et al., Packet Classification on Multiple Fields, Proceedings of the Conference on Applications, Technologies, Architecures, and Protocols for Computer Communication, Association of Computing Machinery, (c)1999, pp. 147–160.

Sriinvasan, et al., Packet Classification on Using Tuple Space Search, Proceedings of the Conference on Applications, Technologies, Architectures, and Protocols for Computer Communication, Association of Computing Machinery, (c)1999, pp. 135–146.

Lakshman, et al., High–speed Policy–based Packet Forwarding Using Efficient Multi–dimensional Range Matching, Proceedings of the ACM SIGCOMM '98, Conference on Applications, Technologies, Architectures, and Protocols for Computer Communication, (c)1998, pp. 203–214.

Gupta, Pankaj, Fast Routing Lookup Mechanisms, Seminar on High–speed Switching Laboratory of Computer Science, MIT, Mar. 16, 1998, pp.

*Primary Examiner*—Kenneth R. Coulter
(74) *Attorney, Agent, or Firm*—Cesari and McKenna, LLP; Michael R. Reinemann (57) ABSTRACT

A system for efficiently organizing data or information into an associative memory device, such as a ternary content addressable memory (TCAM), for subsequent searching divides the TCAM is divided into a plurality of individual stages that are interconnected in a cascading fashion. The data or information that is to be stored into the TCAM for subsequent searching is initially translated into a first Boolean representation, such as a binary decision diagram (BDD), that is partitioned into a plurality of segments. Each segment defines one or more outputs, and the outputs from one segment define the inputs to the next segment. After partitioning the BDD and identifying the resulting outputs, each BDD segment along with its corresponding outputs is mapped into a particular stage of the TCAM.

19 Claims, 7 Drawing Sheets

CASCADING ASSOCIATIVE MEMORY ARRANGEMENT

CROSS-REFERENCE TO RELATED APPLICATIONS

This application is related to the following co-pending, commonly owned U.S. Patent Applications:

U.S. patent application Ser. No. 09/295,187 entitled, METHOD AND APPARATUS FOR ORGANIZING, STORING AND EVALUATING ACCESS CONTROL LISTS, filed Apr. 20, 1999; and U.S. patent application Ser. No. 09/535,810 entitled, METHOD AND APPARATUS FOR HIGH-SPEED PARSING OF NETWORK MESSAGES, filed Mar. 28, 2000.

BACKGROUND OF THE INVENTION

1. Field of the Invention

The present invention relates generally to computer networks, and more specifically, to a method and apparatus for configuring a memory device to efficiently perform matches against long input strings, such as network messages.

2. Background Information

A computer network typically comprises a plurality of interconnected entities that transmit (i.e., "source") or receive (i.e., "sink") data frames. A common type of computer network is a local area network ("LAN") which typically refers to a privately owned network within a single building or campus. LANs employ a data communication protocol (LAN standard), such as Ethernet, FDDI or Token Ring, that defines the functions performed by the data link and physical layers of a communications architecture (i.e., a protocol stack), such as the Open Systems Interconnection (OSI) Reference Model. In many instances, multiple LANs may be interconnected by to form a wide area network ("WAN"), metropolitan area network ("MAN") or intranet. These LANs and/or WANs, moreover, may be coupled through one or more gateways to the Internet.

Each network entity often includes network communication software, which operates in accordance with the Transmission Control Protocol/Internet Protocol (TCP/IP). TCP/IP basically consists of a set of rules defining how entities interact with each other. In particular, TCP/IP defines a series of communication layers, including a transport layer and a network layer. At the transport layer, TCP/IP includes both the User Datagram Protocol (UDP), which is a connectionless transport protocol, and the Transmission Control Protocol (TCP) which is a reliable, connection-oriented transport protocol. When a process at one network entity wishes to communicate with another entity, it formulates one or more messages and passes them to the upper layer of its TCP/IP communication stack. These messages are passed down through each layer of the stack where they are encapsulated into packets and frames. Each layer also adds information in the form of a header to the messages. The frames are then transmitted over the network links as bits. At the destination entity, the bits are re-assembled and passed up the layers of the destination entity's communication stack. At each layer, the corresponding message headers are stripped off, thereby recovering the original message which is handed to the receiving process.

One or more intermediate network devices are often used to couple LANs together and allow the corresponding entities to exchange information. For example, a bridge may be used to provide a "bridging" function between two or more LANs. Alternatively, a switch may be utilized to provide a "switching" function for transferring information, such as data frames or packets, among entities of a computer network. Typically, the switch is a computer having a plurality of ports that couple the switch to several LANs and to other switches. The switching function includes receiving messages at a source port and transferring them to at least one destination port for receipt by another entity. Switches may operate at various levels of the communication stack. For example, a switch may operate at layer 2 which, in the OSI Reference Model, is called the data link layer and includes the Logical Link Control (LLC) and Media Access Control (MAC) sub-layers.

Other intermediate devices, commonly referred to as routers, may operate at higher communication layers, such as layer 3 which, in TCP/IP networks corresponds to the Internet Protocol (IP) layer. IP message packets include a corresponding header which contains an IP source address and an IP destination address. Routers or layer 3 switches may re-assemble or convert received data frames from one LAN standard (e.g., Ethernet) to another (e.g. Token Ring). Thus, layer 3 devices are often used to interconnect dissimilar subnetworks. Some layer 3 intermediate network devices may also examine the transport layer headers of received messages to identify the corresponding TCP or UDP port numbers being utilized by the corresponding network entities. Such extended-capability devices are often referred to as Layer 4, Layer 5, Layer 6 or Layer 7 switches or Network Appliances. Many applications are assigned specific, fixed TCP and/or UDP port numbers in accordance with Request for Comments (RFC) 1700. For example, TCP/UDP port number 80 corresponds to the hyper text transport protocol (HTTP), while port number 21 corresponds to file transfer protocol (ftp) service.

Figure 1:
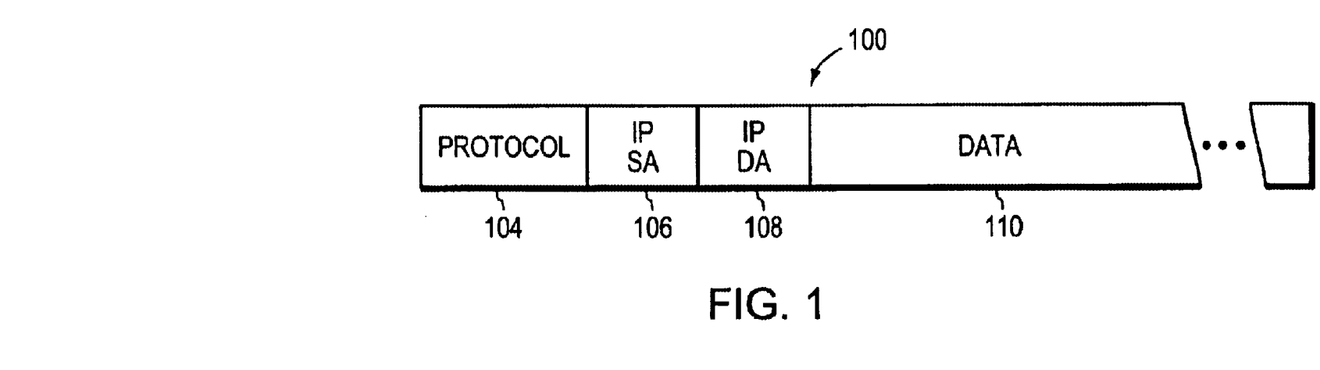
FIGS. 1 and 2, previously discussed, are block diagrams of conventional network messages.
Figure 2:
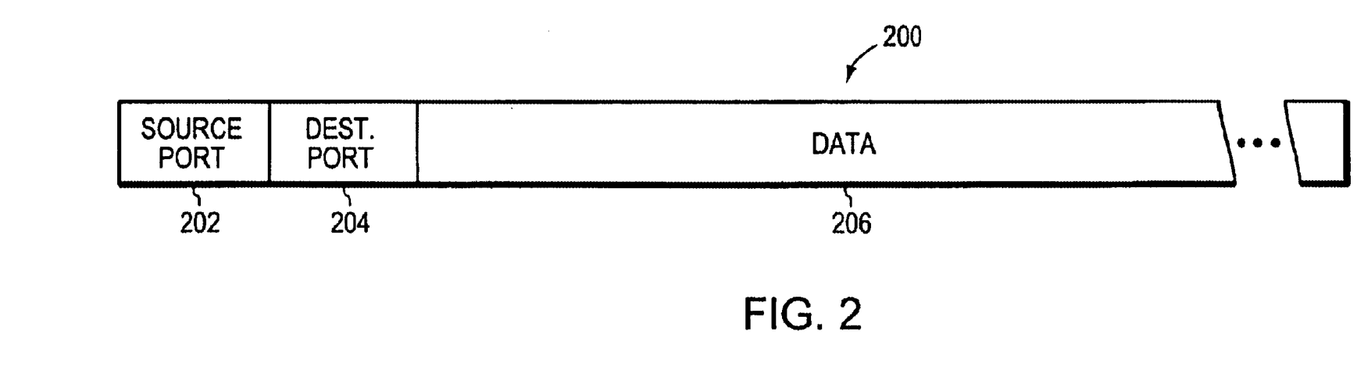

FIG. 1 is a partial block diagram of a Network Layer packet 100 corresponding to the Internet Protocol. Packet 100 includes a protocol field 104, an IP source address (SA) field 106, an IP destination address (DA) field 108 and a data field 110, among others. FIG. 2 is a partial block diagram of a Transport Layer packet 200. Packet 200 includes a source port field 202, a destination port field 204 and a data field 206, among others. As indicated above, Fields 202 and 204 identify the local end points of the connection between the communicating entities and may include flow information and certain predefined or dynamically agreed-upon TCP or UDP port numbers.

Access Control Lists

Some networking software, including the Internetwork Operating System (IOS®) from Cisco Systems, Inc., supports the creation of access control lists or filters, which are typically used to prevent certain traffic from entering or exiting a network. In particular, certain layer 3 intermediate devices utilize access control lists to decide whether received messages should be forwarded or filtered (i.e., dropped) based on certain pre-defined criteria. The criteria may be IP source address, IP destination address, or upper-layer application based on TCP/UDP port numbers. For example, an access control list may allow e-mail to be forwarded, but cause all Telnet traffic to be dropped. Access control lists may be established for both inbound and outbound traffic and are most commonly configured at border devices (i.e., gateways or firewalls) to provide security to the network.

To generate an access control list, a network administrator typically defines a sequence of criteria statements using a conventional text editor or graphical user interface (GUI). As each subsequent statement is defined, it is appended to the end of the list. The completed list is then downloaded to the desired layer 3 intermediate device where it may be stored in the device's non-volatile RAM (NVRAM) typically as a linked list. Upon initialization, the intermediate device copies the access control list to its dynamic memory. When a packet is subsequently received at a given interface of the device, a software module of IOS® tests the received packet against each criteria statement in the list. That is, the statements are checked in the order presented by the list. Once a match is found, the corresponding decision or action (e.g., permit or deny) is returned and applied to the packet. In other words, following a match, no more criteria statements are checked. Accordingly, at the end of each access control list a "deny all traffic" statement is often added. Thus, if a given packet does not match any of the previous criteria statements, the packet will be discarded.

Currently, access control lists are used primarily to provide security. Thus, for a given interface, only a single list is evaluated per direction. The lists, moreover, are relatively short. Nevertheless, the evaluation of such lists by software modules can significantly degrade the intermediate device's performance (e.g., number of packets processed per second). This degradation in performance has been accepted mainly due to a lack of acceptable alternatives. It is proposed, however, to expand the use of access control lists for additional features besides just security decisions. For example, access control lists may also be used to determine whether a given packet should be encrypted and/or whether a particular quality of service (QoS) treatment should be applied. Accordingly, it is anticipated that multiple access control lists may be assigned to a single interface. As additional access control lists are defined and evaluated per packet, the reduction in performance will likely reach unacceptable levels.

In addition, the message fields that may be evaluated by ACLs include IP source address, IP destination address, protocol, TCP/UDP source port, TCP/UDP destination port, virtual local area network (VLAN) identifier, differentiated services codepoint (DSCP), and the physical port on which the message was received. Under version 4 of the Internet Protocol (IPv4), IP source and destination addresses are 32 bits in length. Accordingly, the above information, which is often referred to as the flow label, adds up to approximately 133 bits. With version 6 of the Internet Protocol (IPv6), however, IP addresses are 128 bits long. Assuming the same fields are to be evaluated, the labels being evaluated are now approximately 336 bits long. It is also desirable in certain situations to evaluate higher-level messages, e.g., up to layer 7, which is the application layer. This would further increase the amount of information, and thus the number of bits, being evaluated. The longer the flow label, moreover, the more time that is required for software-based solutions to evaluate the corresponding ACL.

Accordingly, a need exists for a mechanism that can search long strings of data (e.g., 366 bits or more) efficiently and at relatively high-speed.

SUMMARY OF THE INVENTION

Briefly, the invention relates to a method and apparatus for efficiently organizing and storing data or information for subsequent searching. According to the invention, a storage facility includes one or more an associative memory devices, such as a ternary content addressable memory (TCAM). The TCAM is divided into a plurality of stages that are interconnected in a cascading fashion. To improve searching efficiency, the data or information to be stored into the TCAM for subsequent searching is initially translated into a first Boolean representation. In the preferred embodiment, the first Boolean representation is a binary decision diagram (BDD). Before loading the BDD into the associative memory device, the BDD is partitioned into a plurality of segments. Each segment, moreover, defines one or more outputs, and the outputs from one BDD segment define the inputs to the next BDD segment. After partitioning the BDD and identifying the resulting outputs, each BDD segment along with its corresponding outputs is mapped into a particular stage of the TCAM. The TCAM is then ready for matching.

Specifically, a network message may be matched against the information in the TCAM to locate a matching entry. The matching entry preferably specifies the particular action (e.g., drop, forward, delay, encrypt, etc.) that is to be applied to this message. To search the TCAM, a first portion of the network message is input to the first TCAM stage. The output from the first TCAM stage is then input into the second TCAM stage along with a second portion of the network message. The passing of outputs from an upstream TCAM stage to a downstream TCAM stage along with a new message portion is repeated until the entire network message has been evaluated within the TCAM and the final output of the TCAM is a particular action to be applied to the message.

In the preferred embodiment, the storage facility is incorporated into an intermediate network device, such as a switch-router, that processes Internet Protocol Version 6 (IPv6) messages. Furthermore, the data or information being loaded into the TCAM for subsequent searching is preferably one or more access control lists (ACLs). By partitioning the ACLs into multiple segments and defining output/input values between adjacent segments, the statements of the ACLs being searched within the TCAM, which include IPv6 addresses, can be longer than the width of the individual TCAM stages. For example, with the present invention, ACL statements that are more than 300 bits in length can nonetheless be organized into a TCAM whose individual stages are only 144 bits wide, thereby taking advantage of currently available components and reducing overall power consumption.

BRIEF DESCRIPTION OF THE DRAWINGS

The invention description below refers to the accompanying drawings, of which.

DETAILED DESCRIPTION OF AN ILLUSTRATIVE EMBODIMENT

Figure 3:
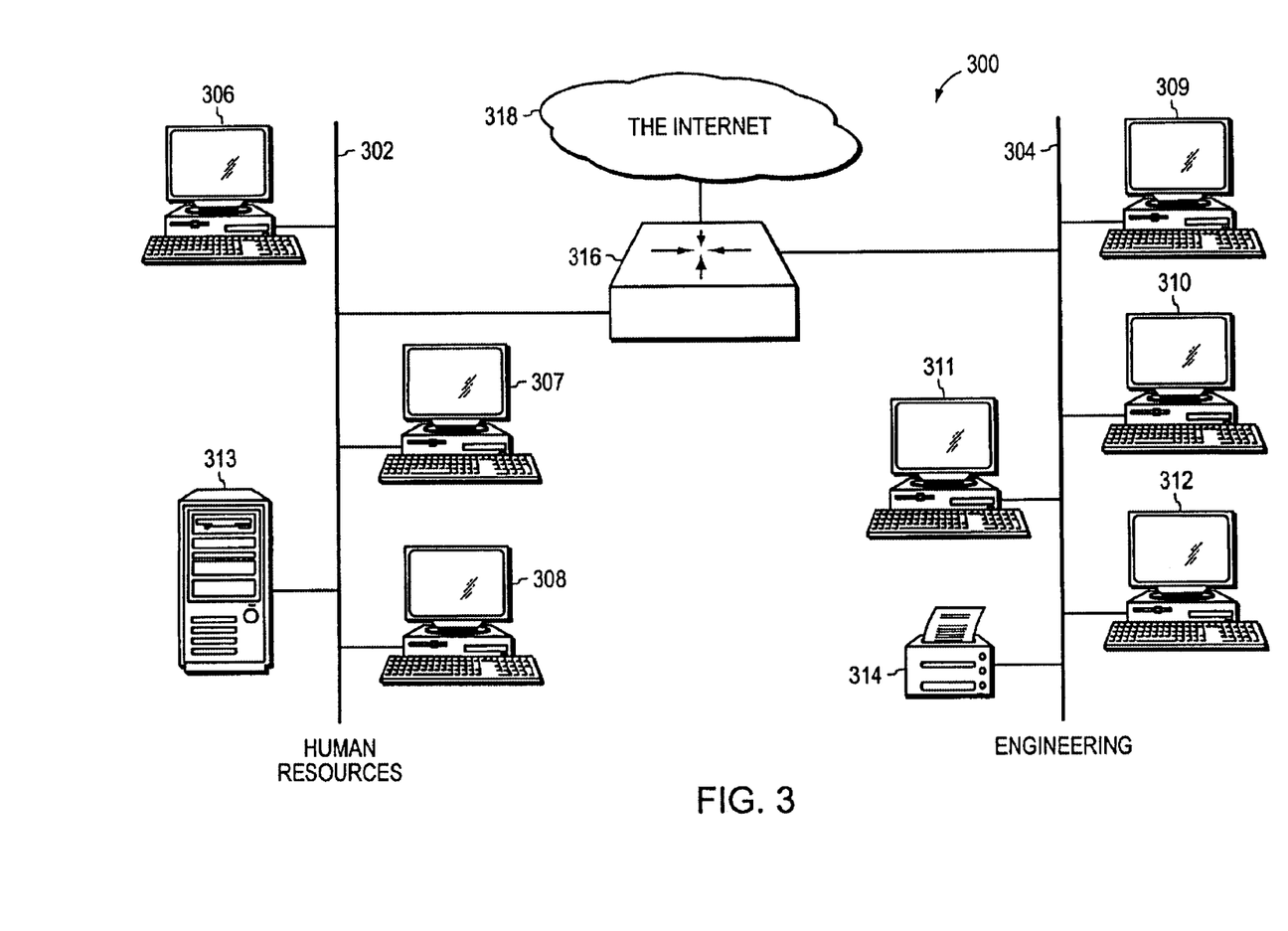
FIG. 3 is a highly schematic diagram of a computer network.

FIG. 3 is a highly schematic block diagram of a computer network 300. Network 300 includes a plurality of local area networks (LANs), such as LAN 302 and 304, each of which may be associated with a different department of an enterprise, such as the human resources and engineering departments of a company. A plurality of end stations, such as end stations 306–312, and servers, such as servers 313 and 314, may be coupled to LANs 302, 304. LANs 302 and 304 may also be interconnected by an intermediate network device 316. Device 316 may also provide LANs 302 and 304 with connectivity to other networks, such as the well-known Internet 318. Software entities (not shown) executing on the various end stations 306–312 and servers 313 and 314 typically communicate with each other by exchanging discrete packets or frames according to predefined protocols, such as the Transmission Control Protocol/Internet Protocol (TCP/IP), the Internet Packet Exchange (IPX) protocol, the AppleTalk protocol, the DECNet protocol or NetBIOS Extended User Interface (NetBEUI) protocol.

Preferably, intermediate network device 316 is a layer 3 or higher intermediate device and thus operates up to the network layer of the communication protocol stack implemented within the network 300. For example, device 316 preferably includes an Internet Protocol (IP) software layer. Device 316 may also implement network services such as route processing, path determination and path switching functions. In the illustrated embodiment, device 316 is a computer having transmitting and receiving circuitry and components, including network interface cards (NICs), establishing physical ports and interfaces for exchanging network messages.

The term layer 3 intermediate device as used herein is intended broadly to cover any intermediate device operating primarily at the internetwork layer, including, without limitation, routers as defined by Request for Comments (RFC) 1812 from the Internet Engineering Task Force (IETF), intermediate devices that are only partially compliant with RFC 1812, intermediate devices that provide additional functionality, such as Virtual Local Area Network (VLAN) support, IEEE 802.1Q support and/or IEEE 802.1D support, etc. Nonetheless, it should be understood that the present invention may also be utilized in whole or in part with other intermediate network devices, such as switches and/or layer 2 intermediate devices, which are also intended to broadly cover any intermediate device operating primarily at the data link layer, including, without limitation, devices that are fully or partially compliant with the IEEE 802.1D MAC Bridge standard and intermediate devices that provide additional functionality, such as Virtual Local Area Network (VLAN) support, IEEE 802.1Q support and/or IEEE 802.1p support, Asynchronous Transfer Mode (ATM) switches, Frame Relay switches, etc.

It should be understood that the network configuration 300 of FIG. 3 is for illustrative purposes only and that the present invention will operate with other, possibly far more complex, network topologies.

Figure 4:
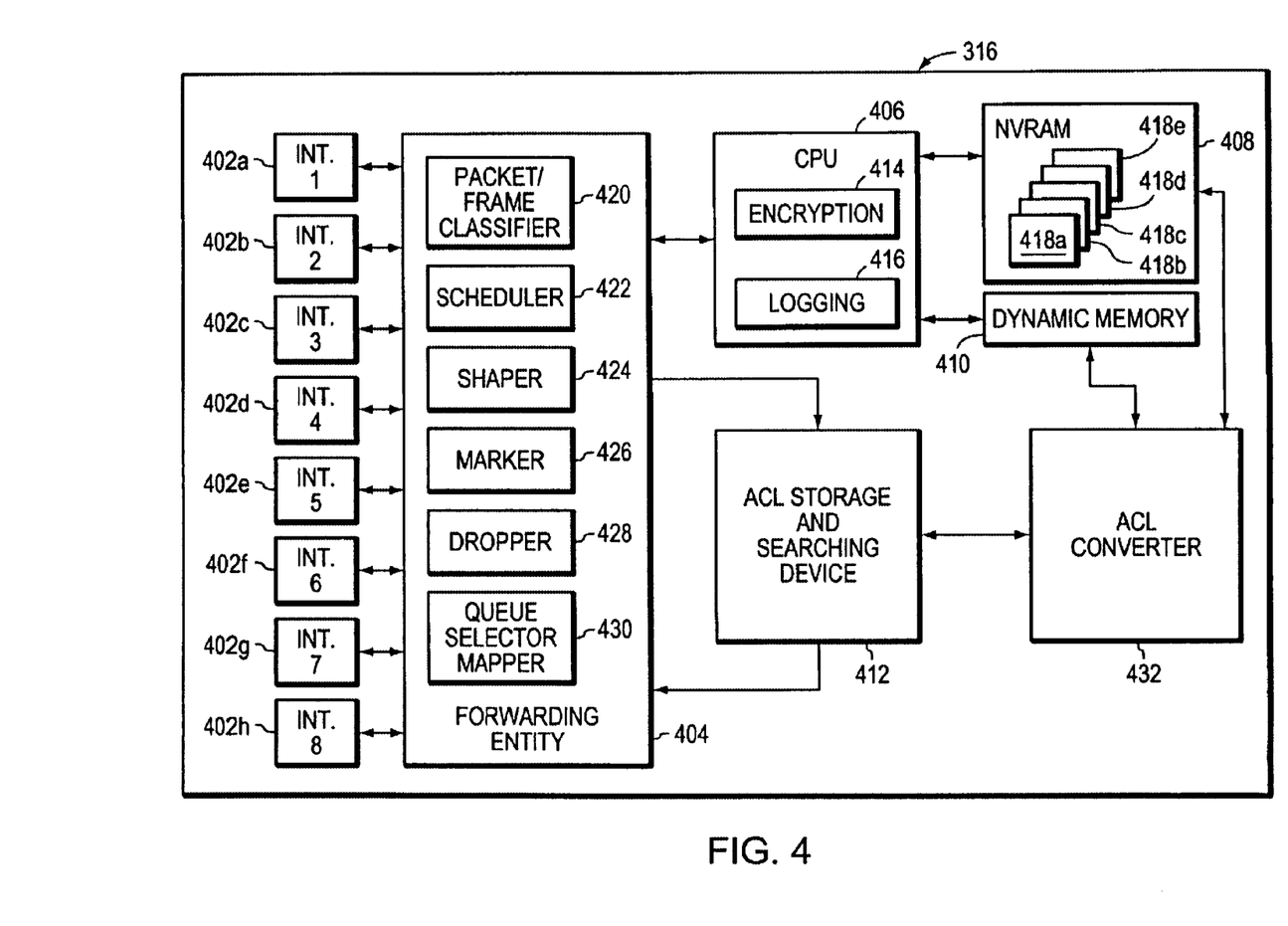
FIG. 4 is a highly schematic, partial block diagram of an intermediate network device in accordance with the present invention.

FIG. 4 is a partial block diagram of intermediate network device 316. Device 316 preferably includes a plurality of interfaces 402a–402h that provide connectivity to the network 300. That is, interfaces 402a–402h are in communication with LANs 302 and 304 (FIG. 3) and Internet 318. Each interface 402a–h, moreover, may be associated with one or more physical ports (not shown). Device 316 further includes at least one forwarding entity 404, a central processing unit (CPU) 406, non-volatile random access memory (NVRAM) 408, dynamic memory 410 and an access control list (ACL) storage and searching device 412. The CPU 406 can be configured in a conventional manner to run one or more executable programs, such as an encryption program and a logging program, which are schematically represented by blocks 414 and 416, respectively. The CPU 406 is also coupled to NVRAM 408 and dynamic memory 410. A plurality of text-based access control lists (ACLs) 418a–e are preferably stored at the NVRAM 408.

Forwarding entity 404 includes a plurality of conventional sub-components or entities configured to implement quality of service (QoS) treatments, such as a packet/frame classifier 420, a scheduler 422, a shaper 424, a marker 426, a dropper 428, and a queue selector/mapper 430. The forwarding entity 404 is also coupled to the CPU 406 and the ACL storage and searching device 412. As described below, the forwarding entity 404 is basically configured to forward or switch network messages among the various interfaces 402a–h.

Device 316 may also include an ACL converter 432. The ACL converter 430 is operatively coupled to NVRAM 408 for accessing the text-based ACLs 418a–e, dynamic memory 410 for processing the ACLs 418a–e, and to the ACL storage and searching device 412 for storing modified versions of the ACLs 418a–e, as described below. ACL converter 432 preferably comprises programmed processing elements containing software programs, such as software modules or libraries, pertaining to the methods described herein and executable by one or more processing elements, such as CPU 406. Other computer readable media may also be used to store and execute the program instructions.

It should be understood that ACL converter 432 may run on or otherwise be executed by CPU 406 or some other processing element (not shown). ACL converter 432 may also be implemented in hardware through a plurality of registers and combinational logic configured to produce sequential logic circuits and cooperating state machines. Those skilled in the art will recognize that other combinations of software and hardware implementations may be advantageously utilized.

A suitable platform for intermediate network device 316 are the Catalyst 8500® series of switch routers and/or the Catalyst® 6000 and 4000 family of multilayer switches from Cisco Systems, Inc. of San Jose, Calif.

Figure 5:
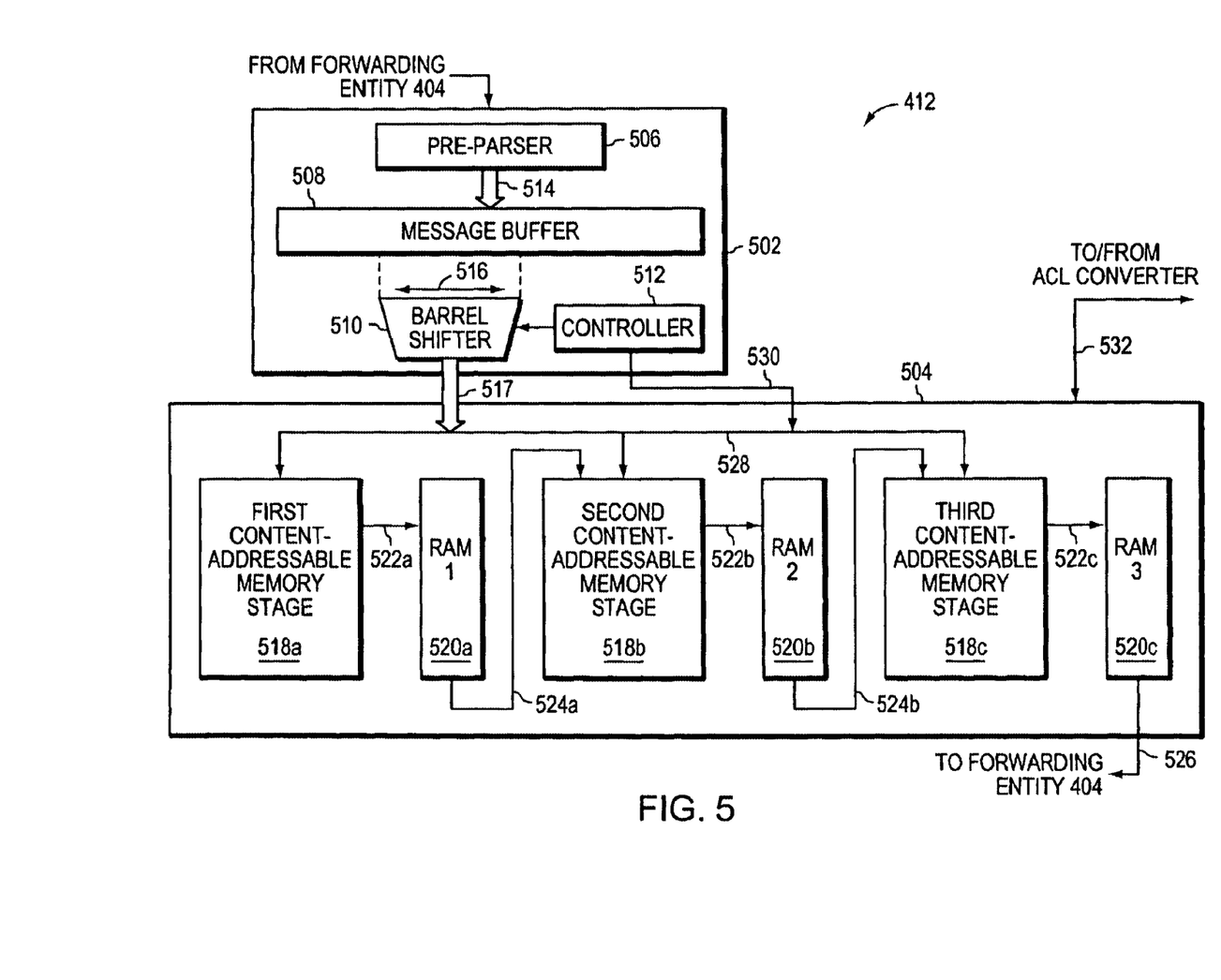
FIG. 5 is a highly schematic illustration of the access control list storage and searching device of FIG. 4.

FIG. 5 is a highly schematic illustration of the ACL storage and searching device 412. Device 412 preferably includes two primary components: a data selector circuit 502, which receives selected network messages from the forwarding entity 404 (FIG. 4), and a storage facility 504 which provides corresponding instructions to the forwarding entity 404. The data selector circuit 502 includes a pre-parser logic 506, a message buffer 508, a barrel shifter 510, and a controller 512. The pre-parser 506 is preferably a logic circuit that is configured and arranged to extract one or more commonly evaluated fields from received network messages in order to speed up processing. The pre-parser 506 preferably prepends these extracted fields to the network message and passes the combination (i.e., network message and appended fields) to the message buffer 508 for storage therein as illustrated by arrow 514. The barrel shifter 510 is configured to reveal a selected segment or portion of the information stored in buffer 510 under the direction of the controller 512. In effect, the controller 512 "slides" the barrel shifter 510 along the message buffer 508 as illustrated by double arrow 516 so as to transfer a selected portion of information from the message buffer 508 to the storage facility 504 for evaluation, as indicated by arrow 517.

In the illustrative embodiment, the storage facility 504 comprises a plurality of ternary content addressable memory (TCAM) stages 518a–c that are interconnected in a cascading fashion. That is, the output from a first TCAM stage, e.g., stage 518a, is provided as input to the next TCAM stage, e.g., stage 518b, and so on. Associated with each TCAM stage 518a–c may be a secondary memory structure or device, such as a random access memory (RAM) 520a–c. Each TCAM stage, e.g., stage 518a, and its associated RAM, e.g., RAM 520a, have a plurality of entries or rows. Each entry or row of the TCAMs, such as TCAM 518a, moreover, includes a pointer that particularly identifies a corresponding entry (i.e., a location) of its associated RAM, i.e., RAM 520a, as illustrated by arrows 522a–c. In other words, there is a one-to-one correspondence between TCAM stage entries and RAM entries. The contents of the identified RAM entry or location, moreover, are provided as an input to the next sequential TCAM stage, as illustrated by arrows 524a–b. This does not apply, however, to the output from the last RAM 518c within the storage facility 504. Instead, the specified contents of the last RAM 518c, which, in the preferred embodiment, contain the particular action to be applied to the network message being evaluated, are returned to the forwarding entity 404 (FIG. 4) as illustrated by arrow 526.

Each row or entry of a TCAM stage 518a–c has a plurality of cells (not shown) that are associated with or assigned one of three possible values, "0", "1" or "don't care". A preferred TCAM has 512K rows of 144 bit length each, although TCAMs of other sizes can be used. To implement the "don't care" value, each TCAM stage 518a–c may be segregated into blocks of cells (each cell being either asserted or de-asserted) and a corresponding mask applied to determine whether the particular cells of its block are "care" or "don't care".

The output of the barrel shifter 510, which is schematically represented by arrow 517, may be provided to a communication means, such as bus 528, which may be part of the storage facility 504. Each TCAM stage 518a–c, moreover, receives its input or at least part of its input from bus 528. The controller 512 may also be coupled to bus 528, as indicated by arrow 530, in order to manage which particular TCAM stage 518a–c receives the selected window from the barrel shifter 510. The storage facility 504 is also coupled to the ACL converter 432 (FIG. 4) as indicated by bi-directional arrow 532 so that ACL converter 432 can program the storage facility 504 as described below.

The ACL storage and searching device 412 is preferably formed from one or more Application Specific Integrated Circuits (ASICs) or Field Programmable Gate Arrays (FPGAs). Nonetheless, those skilled in the art will recognize that other combinations of hardware components in addition to those specifically described herein may be advantageously utilized to achieve the objectives of the present invention. For example, if TCAMs of sufficient width were reasonably or commercially available, then the associated RAMs 520a–c might be rendered unnecessary. That is, a sufficiently wide TCAM could store both the information to be searched and the information to be passed to the next TCAM stage. In that case, the storage facility 504 would simply comprise a plurality of TCAM stages whose outputs would be provided directly to the next TCAM stage.

A suitable TCAM for use with the present invention is described in co-pending U.S. patent application Ser. No. 09/130,890, filed Aug. 7, 1998, which is hereby incorporated by reference in its entirety. Other suitable TCAMs are commercially available from NetLogic Microsystems, Inc. of Mountain View, Calif. and Music Semiconductors of Hackettstown, N.J.

The RAMs 520a–c may be programmed through one or more conventional write operations, while the TCAM stages 518a–c may be programmed through a dedicated port (e.g., a Parallel Input/Output port), as indicated by arrow 532 (FIG. 5).

Creation and Assignment of ACLs to Interfaces

First, a network administrator preferably creates one or more access control lists in a conventional manner. For example, the administrator preferably utilizes a conventional text editor at a management station (not shown) to create the access control lists. Each access control list may be given a name, such as ACL 101, ACL 202, ACL 303, etc., and is preferably arranged in a table array having multiple rows and columns. The rows of an ACL corresponds to the particular Access Control Entry (ACE) statements of the respective ACL. The ACEs basically specify the various criteria for the corresponding ACL. These criteria may include network layer source and destination addresses, transport layer source and destination ports, and transport layer protocol. Each ACE further includes an action that corresponds to the particular action that is to be applied to network messages matching a corresponding ACE. In the preferred embodiment, permissible actions include permit, deny, permit and log, and deny and log.

The matching is preferably performed logically as a series of sequential steps starting with the first ACE and moving, one ACE at a time, toward the last ACE in the ACL. Once a match is located, the corresponding action is returned and the processing stops. That is, no additional ACEs are examined. If a match is made with an ACE statement having a "permit" action, the packet is forwarded. If a match is made with an ACE statement having a "deny" action, the packet is dropped. If the matching action is "permit and log", then the respective message is forwarded and an entry is made in a conventional message log. Similarly, if the matching action is "deny and log", then the respective message is dropped and a log entry made. If no ACE of the subject ACL matches the message, an implicit action located at the end of the ACL is typically returned (e.g., permit or deny).

Those skilled in the art will understand that greater or fewer message criteria may be employed, and that other actions may be specified.

The text-based ACLs that are to be utilized at a given intermediate device are then downloaded to that device in a conventional manner and stored, preferably in non-volatile memory. In particular, the ACLs may be maintained in memory as ASCII text or in other formats. For example, ACLs 418a–416e (FIG. 4) may be downloaded to device 316 by the network administrator and stored at NVRAM 408. Next, the network administrator preferably assigns one or more ACLs 418a–e to each interface 402a–e per direction (e.g., inbound or outbound) and may associate a given function or "feature" with each of the assigned ACLs. In the preferred embodiment, the network administrator utilizes one ACL for security and one or more other ACLs to implement additional features, such as QoS treatments, at the interface per direction. For example, the network administrator may assign ACL 418a (ACL 101) to interface 402a for purposes of input security control.

Translation of Access Control Lists into Binary Decision Diagram Representation

Once the text-based ACLs have been downloaded to device 316, stored at NVRAM 408 and assigned to a particular interface, the ACL converter 432 proceeds to process them for storage in the ACL storage and searching device 412. In summary, ACL converter 432 transforms the text-based ACLs 418a–e into corresponding Binary Decision Diagram ("BDD") representations. The ACL converter 432 then merges all of the ACLs assigned to each interface into a single, unified BDD representation. The single, unified BDD representation is then partitioned into a plurality of segments, and the outputs of each segment are identified. Each BDD segment is then translated and mapped into a corresponding TCAM stage 518a–c of the storage facility 504, while its corresponding outputs are mapped into the respective RAM 520a–c. Once the BDD has been mapped into the storage facility 504, network messages received at device 316 can be evaluated.

Figure 6A:
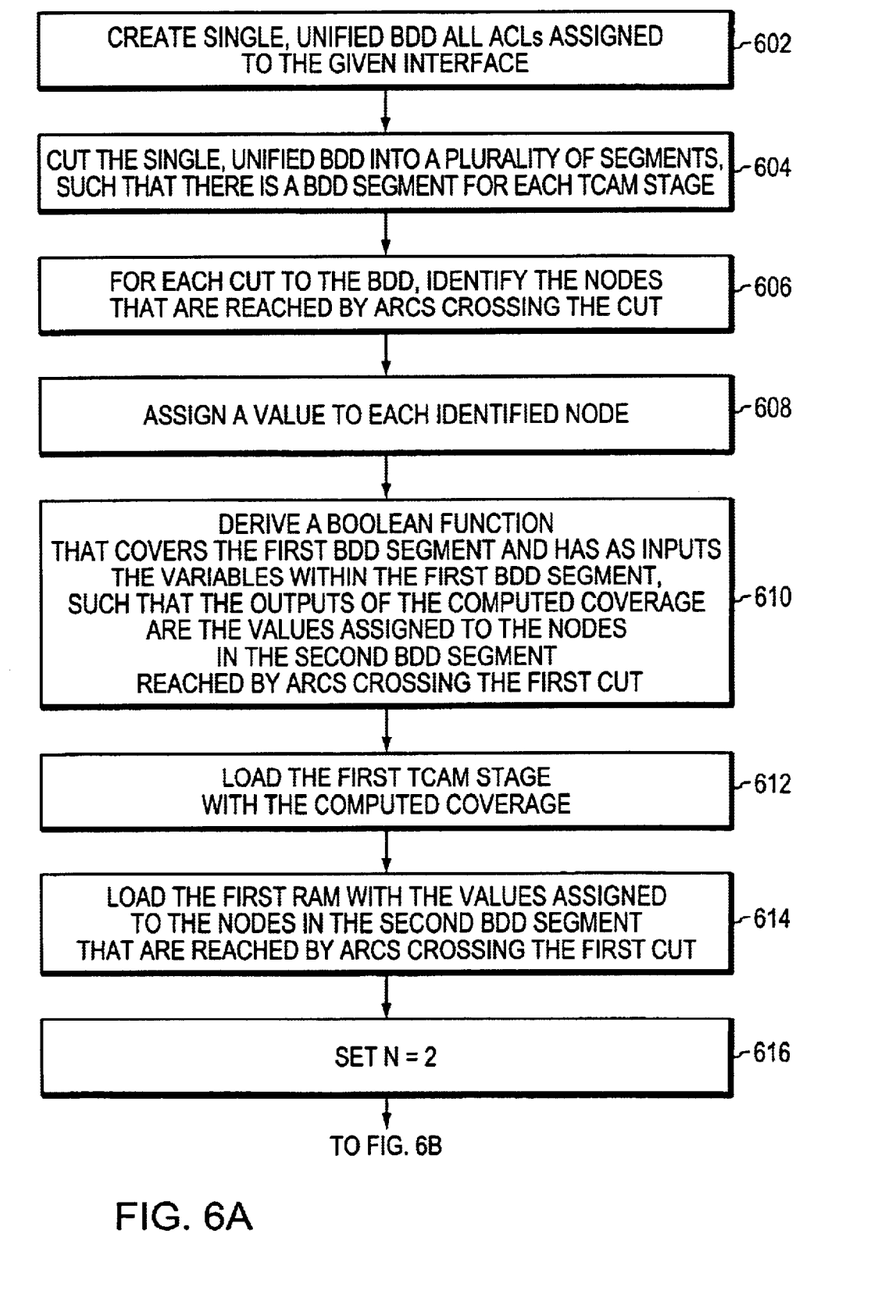
FIGS. 6A–6B is a flow diagram of the preferred methods of the present invention.
Figure 6B:
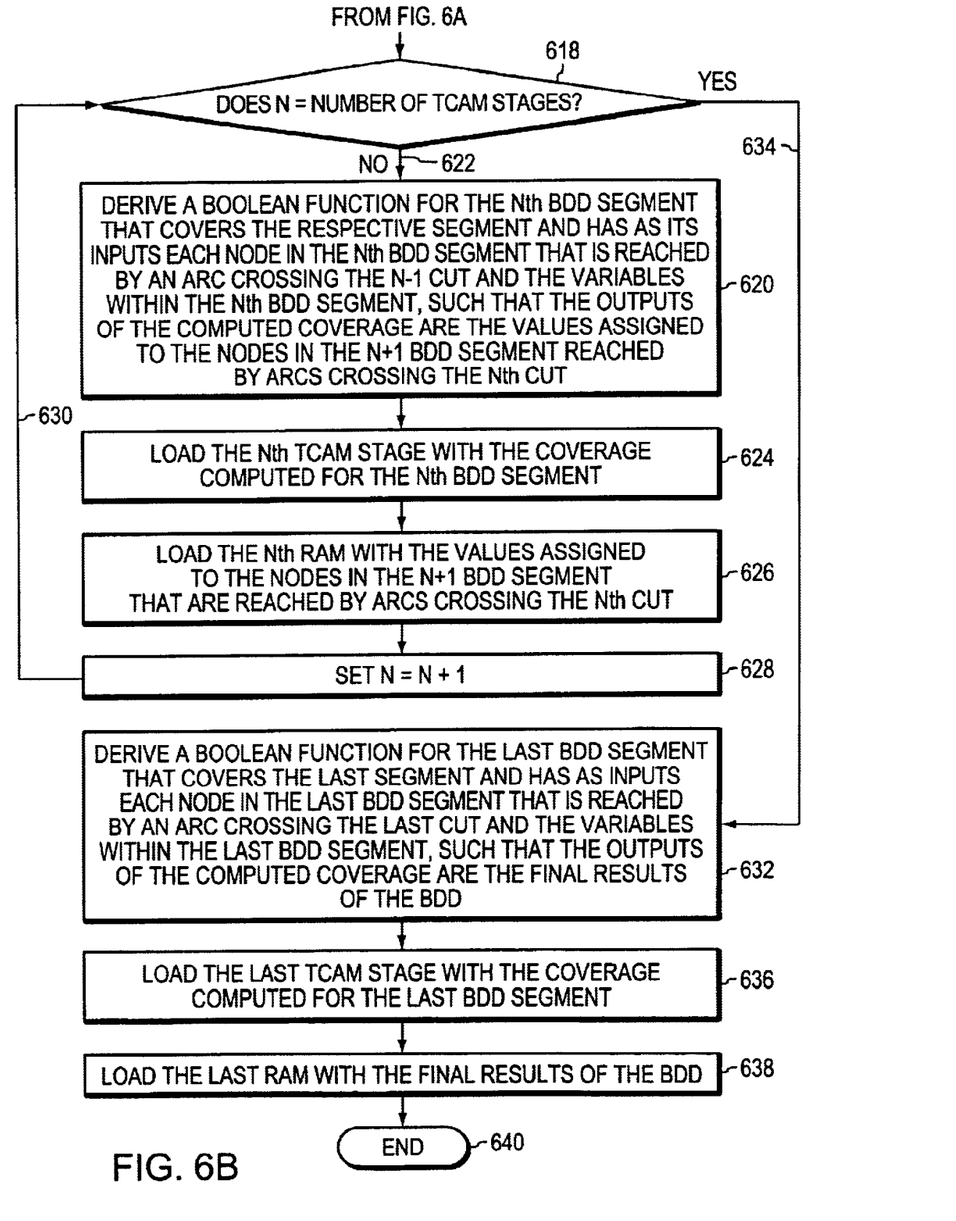

FIGS. 6A–6B are a flow diagram of the preferred steps of the method of the present invention. As indicated at step 602, the ACL converter 432 creates a single, unified BDD representation of all of the ACLs assigned to a given interface, e.g., interface 402a. Suitable techniques for creating a single, unified BDD representation from multiple ACLs is described in co-pending U.S. patent application Ser. No. 09/295,187, filed Apr. 20, 1999 (hereinafter the "'187 patent application"), which is hereby incorporated by reference in its entirety.

Figure 7:
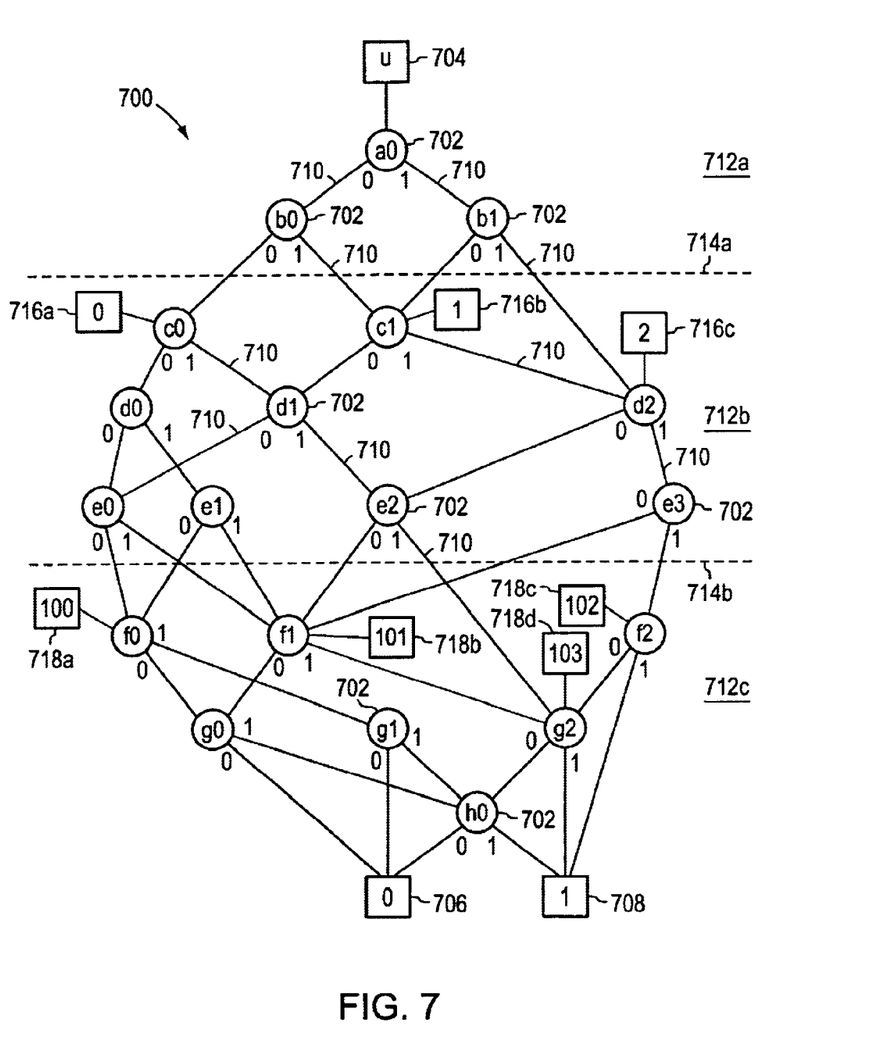
FIG. 7 is a schematic illustration of a merged access control list in binary decision diagram (BDD) format.

FIG. 7 is a highly schematic representation of a single, unified BDD 700 created from the plurality of ACLs assigned to a given interface. ACL 700 includes a plurality of interconnected nodes 702 that are arranged in levels. Each node 702, moreover, has a handle or label (e.g., a0, b0, b1, c0, c1, d0, d1, d2, etc.) that identifies the respective node 702. The ACL 700 further includes a top entry point or root 704 and two decision points 706 (e.g., "0") and 708 (e.g., "1"). Each level of the BDD 700 (and all nodes 702 on that level) preferably corresponds to a particular bit from an ACE criteria statement of the corresponding ACL. Thus, a particular node 702 at each level of BDD 700 may be tested against a corresponding bit of a network message. Entry point 704, nodes 702 and decision points 706, 708 are interconnection by arcs or lines 710. In particular, each node 702 has both a true arc 710a (which may be associated with "1") and an else arc 710b (which may be associated with "0"). If the test for a given node 702 is true, i.e., the value of the network message being evaluated matches the node's value, then processing follows the true arc 710a from the respective node 702. If the test is not true, i.e., the value of the message does not match the node's value, then processing follows the else arc 710b from the respective node 702.

Other conventions, such as showing true arcs as solid lines and else arcs as dotted lines, may also be used.

The two decision blocks 706 and 708 at the bottom of the BDD 700 correspond to the decision of the particular ACLs (e.g., permit or deny) that have been merged. For a given set of merged ACLs having more than two decisions (e.g., permit, deny, permit and log, and deny and log), multiple decision blocks may be present.

Once the single, unified BDD 700 has been generated, the next step is to cut the BDD 700 into a plurality of segments, as indicated at step 604 (FIG. 6A). In particular, the BDD 700 is cut such that the resulting number of BDD segments equals the number of TCAM stages 518a–c (FIG. 5) in the storage facility 504. In the illustrative embodiment, there are three TCAM stages 518-c. Accordingly, BDD 700 is partitioned into three segments 712a–c by imposing two cuts 714a–b, which are illustrated by dashed lines. Each cut 714a–b is preferably made between adjacent levels of the BDD 700. Thus, each cut 714a–b is traversed by a plurality of arcs 710. Cuts 714a–b preferably do not cross or otherwise split the nodes 702 of the BDD 700. Thus, each node 702 of the BDD 700 resides within a single BDD segment 712a–c.

The cuts may also be positioned so that number of variables (i.e., levels) within each BDD segment corresponds the available width of the TCAM stages. That is, assuming each TCAM stage has an available width of approximately 112 bits, then the cuts are made such that each BDD segment has 112 variables.

Next, for each cut 714a–b, the ACL converter 432 identifies those nodes 702 within the BDD segments 712a–c that are reached by arcs 710 crossing the respective cut, as indicated at step 606. For cut 714a, nodes c0, c1 and d2 are each reached by an arc 710 that crosses cut 714a. For cut 714b, nodes f0, f1, f2 and g2 are each reached by an arc 710 that crosses cut 714b. At step 608, a value is assigned to each of the nodes identified at step 606. For example, nodes c0, c1 and d2, which correspond to the first cut 714a, may be assigned the values 0, 1 and 2, respectively, as indicated by corresponding sub-root blocks 716a–c. Nodes f0, f1, f2 and g2, which correspond to the second cut 714b, may be assigned values 100, 101, 102 and 103, respectively, as indicated by corresponding sub-root blocks 718a–d. Because the values assigned to nodes associated with the same cut (e.g., nodes c0, c1 and d2) will be loaded into the same RAM 520a–c, as described below, they must all be distinct. However, nodes associated with different cuts (e.g., nodes c0 and f0) may be assigned the same value, since they will be loaded into different RAMs 520a–c, and thus there will be no confusion. In other words, the assigned values may be re-used at different cuts.

For BDDs representing ACLs compatible with IPv6, the values are preferably represented in thirty-two bit format.

The ACL converter 432 next derives a Boolean function that covers the first BDD segment 712a as a function of the variables within first segment 712a, which are represented by the levels of segment 712a, as indicated at step 610. The output or result of this computed coverage, moreover, gives the particular values assigned to the nodes 702 reached by arcs 710 crossing the first cut 714a (i.e., values 0, 1, and 2). That is, the ACL converter 432 derives a Boolean function, preferably in Sum of Product (SOP) format, whose inputs are the variables of the first BDD segment (i.e., variables "a" and "b"), and whose possible outputs are the values assigned to the nodes 702 reached by arcs 710 crossing the first cut 714a, i.e., nodes c0, c1 and d2, which have been assigned values 0, 1 and 2, respectively. Applying an input series of a0=TRUE and b1=FALSE to the computed coverage, for example, produces an output of "1", which, as shown in FIG. 7, is the value assigned to node c1, and is reached by traversing the TRUE arc 710 from node a0 and the FALSE arc 710 from node b1.

The computed coverage is then loaded into the first TCAM stage 518a, as indicated at block 612. The SOP format for the computed coverage is preferred because this format is most easily translated into a TCAM. In particular, each product or implicant of an SOP function can implemented at a row of a TCAM. Although a disjoint SOP cover can be computed directly from the BDD segment 712a, the result is often suboptimal, because the number of product terms (i.e., implicants) is not minimized. To reduce the number of product terms (and thereby reduce the number of rows needed in the TCAM), the ACL converter 432 first creates a Zero-Suppressed Binary Decision Diagram (ZDD) for the first BDD segment 712a, which can be more efficient at producing covers, and then computes a cover from the ZDD in SOP format. Suitable translation means for obtaining a ZDD from a BDD are described in the '187 patent application.

The results of the computed coverage (i.e., the values assigned to the nodes reached by arcs crossing the first cut 714a) are then loaded into the RAM associated with the first TCAM stage 518a, i.e., RAM 520a, as indicated at step 614. The RAM 520a is loaded, moreover, so that it matches the loading of the computed coverage in the first TCAM stage 518a. More specifically, each row of the first TCAM stage 518a corresponds to a particular path through the first BDD segment 712a ending at a node in the second BDD segment 712b that is reached by an arc crossing the first cut 714a. Each of these nodes (i.e., nodes c0, c1 and d2), moreover, have been assigned a value (i.e., values 0, 1, and 2). In addition, each particular entry of RAM 520a corresponds to the specific result reached by following the path through the BDD segment represented by that RAM entry's corresponding row in the TCAM.

After loading the first stage TCAM 518a and its corresponding RAM 520a, the ACL converter 432 sets a counter N to "2", as indicated by block 616. The ACL converter 412 then tests the counter N to see if it is equal to the number of TCAM stages within the storage facility 504, as indicated by decision block 618 (FIG. 6B). In this illustrative embodiment, there are 3 TCAM stages 518a–c. Thus, the response to decision block 616 is no. Accordingly, the ACL converter 432 derives a Boolean function for the Nth BDD segment (i.e., segment 712b), as indicated by block 620, which is reached by following No arrow 622 from decision block 618. The inputs for this function comprise two components: (1) each node 702 that is reached by an arc 710 crossing the N-1 cut (i.e., cut 714a), namely, nodes c0, c1 and d2; and (2) the variables within Nth segment (i.e., segment 712b), namely variables "c", "d" and "e". The outputs of this function are the values assigned to the nodes 702 of the N+1 BDD segment (i.e., segment 712c) reached by arcs 710 crossing the N+1 cut (i.e., cut 714b). That is, the outputs of these functions are 100, 101, 102, and 103, since these are the values assigned to nodes f0, f1, g2, and f2. Again, the function is preferably in SOP format.

The ACL converter 432 then loads the Nth TCAM stage (i.e., stage 518b) with this computed coverage, as indicated at block 624. ACL converter 432 also loads the Nth RAM (i.e., RAM 520b) with the values assigned to the nodes in the N+1 BDD segment (i.e., segment 712c) reached by arcs 710 crossing the Nth cut (i.e., cut 714b), as indicated at block 626. Next, ACL converter 432 increments the counter N by 1, as indicated by block 628. After incrementing the counter N, processing returns to decision block 618 as shown by arrow 630, at which point ACL converter 432 again tests the counter N to see if it equals the number of TCAM stages within storage facility 504. If not, steps 620 and 624–628 are repeated for the next BDD segment. If the counter N does equal the number of TCAM stages, processing continues at block 632 as shown by Yes arrow 634 extending from decision block 618.

At step 632 the ACL converter 432 derives a Boolean function for the last BDD segment (i.e., segment 712c). The inputs for this function are the nodes 702 that are reached by an arc 710 crossing the last cut (i.e., cut 714b), namely, nodes f0, f1, g2 and f2, as well as the variables within last BDD segment 712c (i.e., "f", "g" and "h"). The outputs of this function are the final results 706, 708 of the BDD 700. That is, the outputs are 0 and 1. Again, the derived function is preferably in SOP format. The ACL converter 432 then loads the last TCAM stage 518c with this computed coverage, as indicated at block 636. ACL converter 432 also loads the last RAM 520c with the final results of the BDD 700, as indicated at block 638. At this point, loading of the ACL storage and searching device 412 is complete, as indicated by End block 640, and device 412 is ready for searching.

Those skilled in the art will understand that the functions described above can be derived variable-by-variable, node-by-node or in other ways.

Operation of the Present Invention

The ACL storage and searching device 412 preferably operates as follows. Suppose a network message, such as message 100 (FIG. 1), is received at interface 402a (FIG. 4) of device 316. Message 100 may have originated from the Internet 318 and be addressed to end station 312 in the engineering department. The message 100 is captured and provided to the forwarding entity 404. Forwarding entity 404 passes message 100 to the ACL storage and searching device 412 for processing. Here, the pre-parser logic 506 extracts the pre-defined fields. These fields may include the IP SA field 106, the IP DA field 108 and the Protocol field 104 of the network layer message 100, and the contents of the Source Port field 202 and the Destination Port field 204 from the corresponding TCP message 200. Preferably, logic 506 also extracts the Differentiated Services Codepoint (DSCP) and/or Type of Service (TOS) fields. These fields are prepended to message 100 and the combination of prepended fields and message 100 is stored in message buffer 508.

Each TCAM stage 518a–c is preferably on the order of 144 bits wide, and each RAM 520a–c is on the order of 32 bits wide. Since each TCAM stage, except for the first stage, receives an input from the prior RAM, only about 112 bits of each TCAM stage 520b–c are available for evaluating the subject message. However, the total number of bits just from the extracted fields is on the order of 296 bits. Accordingly, controller 512 utilizes barrel shifter 510 to provide selective portions of the contents of message buffer 508 to the storage facility 504.

More specifically, the controller 512 then moves the barrel shifter 510 along the message buffer 508 in order to extract a "window" of information (e.g., some portion of data) from the message buffer 508. This window of information is then input to the storage facility 504. In particular, the controller 512 initially slides the barrel shifter to its full left position in order to start with the beginning of the message buffer 508. This start window, which may be up to 144 bits long, is input to the first TCAM stage 518a as represented by arrow 517. The first TCAM stage 518a compares the contents of the window to each of its rows. The first matching row specifies a corresponding location in first RAM 520a. The contents of the specified location of the first RAM 520a are provided as an input to the second TCAM stage 518b via arrow 524a. The controller 512 also moves the barrel shifter 510 to select a new window of data from message buffer 508, which may be up to 112 bits long, for input to the second TCAM stage 518b. Thus, the second TCAM stage 518b compares its entries to the result from the first RAM 520a and the new window of data from the message buffer 508.

The first matching entry of second TCAM stage 518b specifies a corresponding location in the second RAM 520b. The contents of this location in the second RAM 520b are passed as an input to the third TCAM stage 518c via arrow 524b. Again, controller 512 moves the barrel shifter to select yet another window of data from the message buffer 508 to be provided as an input to the third TCAM stage 518c in combination with the results from the second RAM 520b. The first matching entry of third TCAM stage 518c specifies a corresponding location in the third RAM 520c. The contents of this location contain the particular action that is to be applied to the network message. This action is returned to the forwarding entity 404 as shown by arrow 526.

Those skilled in the art will understand that multiple selector circuits 502 may be coupled to the same storage facility 504 and/or that registers at the outputs of the TCAMs and/or RAMs can be added to achieve a pipelined architectural design, allowing multiple messages to be processed at the same time. In this embodiment, each such selector circuit 502 is configured to submit inputs to the storage facility 504 substantially simultaneously.

Forwarding entity 404 then implements the specified action on the network message 100. For example, based on the IP SA of the message, the action may be "drop". In response, forwarding entity 404 simply discards the message. As described above, other possible actions include "forward" (i.e., switch the message to the specified destination interface), apply some QoS treatment and switch the message to the specified destination interface, forward the message 100 to the CPU 406 for additional processing (e.g., encryption or logging), etc. Once the forwarding entity 404 has implemented the appropriate action, it is ready to process the next message. As shown, there is no need for the forwarding entity 404 to evaluate multiple ACLs for each message. Furthermore, message evaluation by the ACL storage and searching device 412 can be performed at high speeds. Accordingly, forwarding entity 404 can process messages much more quickly than the prior art devices. Indeed, by utilizing the programmed ACL storage and searching device 412 of the present invention, switch 316 is able to process IPv6 network messages at rates of multi-Gigabits per second.

It should be understood that rather than having multiple physical TCAMs, the storage facility 504 may have a single physical TCAM that is logically partitioned into multiple segments. In this case, the output of the one RAM associated with the single, physical TCAM is fed back into the TCAM along with a new message portion from the barrel shifter 510. Those skilled in the art will recognize with this embodiment of the invention that all of the nodes reached by arcs crossing the cuts of the corresponding BDD must be assigned unique values.

In addition, ACL converter 432 may be remotely located from the intermediate network device 316. For example, ACL converter 432 may be located at a management station. In this embodiment, processing of the text-based ACLs takes place at the management station. The ACL converter 432 then remotely loads the storage facility 504 at the device 316.

The foregoing description has been directed to specific embodiments of this invention. It will be apparent, however, that other variations and modifications may be made to the described embodiments, with the attainment of some or all of their advantages. For example, although the illustrative embodiment of the invention has been described in connection with the processing of IPv6 messages, those skilled in the art will recognize that it may be used to search other data records or files, including other message fields and even the data portions of messages. Therefore, it is an object of the appended claims to cover all such variations and modifications as come within the true spirit and scope of the invention.

What is claimed is:

1. An information storage and searching device, the device comprising:
    a buffer for storing data to be searched,
    a barrel shifter operably controllable to select at least a portion of the buffer's contents; and
    a storage facility coupled to the barrel shifter so as to receive the selected portion of the buffer's contents, the storage facility having a plurality of associative memories arranged in a cascading fashion such that the output from an upstream associative memory is provided to at least one downstream associative memory, the associative memory being loaded with information against which data in the buffer is to be matched, wherein
    the information is translated into a Boolean function prior to being loaded into the associative memories, and
    each associative memory stores a segment of the Boolean function.

2. The information storage and searching device of claim 1 further wherein the barrel shifter inputs a different portion of the buffer's contents into each associative memory.

3. The information storage and searching device of claim 2 further wherein each downstream associative memory compares its segment of information against the output from its respective upstream associative memory and the selected portion of the buffer's contents.

4. The information storage and searching device of claim 3 further wherein
    each associative memory has a plurality of entries,
    the storage facility further comprises a plurality of secondary memories each having a plurality of storage locations, and
    each secondary memory is associated with a corresponding associative memory such that each associative memory entry identifies a particular storage location of its associated secondary memory.

5. The information storage and searching device of claim 4 further wherein the Boolean function is a Binary Decision Diagram (BDD), and each associative memory stores a different BDD segment.

6. The information storage and searching device of claim 5 wherein each associative memory is a ternary content addressable memory (TCAM) supporting don't care values.

7. The information storage and searching device of claim 6 further comprising a controller operatively coupled to the barrel shifter, the controller configured to direct the barrel shifter to retrieve a selected portion of the buffer's contents.

8. The information storage and searching device of claim 7 wherein the information stored in the TCAMs corresponds to one or more access control lists (ACLs), and the data stored in the buffer corresponds to a network message.

9. An intermediate network device for use in processing and forwarding network messages in a computer network, the intermediate network device comprising:
    a plurality of ports for connecting the device to the computer network, each port configured to receive and forward network messages;
    a forwarding entity coupled to the ports for processing the network messages; and
    an information storage and searching device coupled to the forwarding entity for receiving one or more of the network messages, the information storage and searching device comprising:
        a buffer for storing the one or more network messages,
        means for selecting at least a portion of the buffer's contents; and
        a storage facility coupled to the selecting means so as to receive the selected portion of the buffer's contents, the storage facility having a plurality of associative memories arranged in a cascading fashion such that the output from an upstream associative memory is provided to a downstream associative memory, the associative memories being loaded with information against which data in the buffer is to be searched, wherein the information is translated into a Boolean function prior to being loaded into the associative memories, and each associative memory stores a segment of the Boolean function.

10. The intermediate network device of claim 9 wherein the selecting means of the information storage and searching device inputs a different portion of the buffer's contents into each associative memory.

11. The intermediate network device of claim 10 wherein the Boolean function is a Binary Decision Diagram (BDD), and each associative memory stores a different BDD segment.

12. The intermediate network device of claim 11 wherein the associative memories are ternary content addressable memory (TCAM) supporting don't care values.

13. A method of loading a storage facility having a plurality of associative memory stages with information to be matched, the method comprising the steps of:

translating the information into a Binary Decision Diagram (BDD), the BDD having a plurality of nodes interconnected by arcs and one or more results;

cutting the BDD into a plurality of segments such that the number of BDD segments corresponds to the number of associative memory stages in the storage facility;

assigning a value to each BDD node reached by an arc crossing a cut;

computing one or more coverages for each BDD segment such that the output of the coverage are either the values assigned to the BDD nodes in the next adjacent BDD segment or the results of the BDD;

loading each associative memory stage with the one or more computed coverages for the respective BDD segment; and loading each associative memory stage with either the values assigned to the BDD nodes in the next adjacent BDD segment or the results of the BDD.

14. The method of claim 13 wherein the BDD includes a set of variables and each BDD segment includes a sub-set of the variables, and each computed coverage has as its variables, the sub-set of variables from the corresponding BDD segment.

15. The method of claim 14 wherein each associative memory stage includes a corresponding secondary memory having a plurality of storage locations, and the values assigned to the BDD nodes reached by arcs crossing a cut and the results of the BDD are loaded into the storage locations of the secondary memories.

16. The method of claim 15 wherein the associative memories are ternary content addressable memory (TCAM) supporting don't care values.

17. The method of claim 16 wherein the information stored in the TCAMs corresponds to one or more access control lists (ACLs), and the data being matched against the contents of the TCAMs corresponds to a network message.

18. A computer readable medium containing executable program instructions for loading a storage facility having a plurality of associative memory stages with information to be matched, the executable program instructions comprising steps for:

loading a storage facility having a plurality of associative memory stages with information to be matched, the method comprising the steps of:

translating the information into a Binary Decision Diagram (BDD), the BDD having a plurality of nodes interconnected by arcs and one or more results;

cutting the BDD into a plurality of segments such that the number of BDD segments corresponds to the number of associative memory stages in the storage facility;

assigning a value to each BDD node reached by an arc crossing a cut;

computing one or more coverages for each BDD segment such that the output of the coverage are either the values assigned to the BDD nodes in the next adjacent BDD segment or the results of the BDD;

loading each associative memory stage with the one or more computed coverages for the respective BDD segment; and loading each associative memory stage with either the values assigned to the BDD nodes in the next adjacent BDD segment or the results of the BDD.

19. The computer readable medium of claim 18 wherein each BDD segment includes a plurality of variables and the one or more coverages for a given BDD segment has as inputs the values assigned to the BDD nodes within the given BDD segment that are reached by arcs from the previous BDD segment, and the variables within the given BDD segment.

* * * * *